(12) United States Patent
Khlat

(10) Patent No.: US 10,958,244 B2
(45) Date of Patent: Mar. 23, 2021

(54) ACOUSTIC FILTER APPARATUS HAVING CONFIGURABLE PARALLEL RESONANCE FREQUENCIES

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/398,798

(22) Filed: Apr. 30, 2019

(65) Prior Publication Data

US 2020/0136589 A1 Apr. 30, 2020

Related U.S. Application Data

(60) Provisional application No. 62/751,188, filed on Oct. 26, 2018.

(51) Int. Cl.
*H03H 9/54* (2006.01)
*H03H 9/64* (2006.01)
(Continued)

(52) U.S. Cl.
CPC .......... *H03H 9/568* (2013.01); *H01H 1/0036* (2013.01); *H03H 9/15* (2013.01); *H03H 2009/155* (2013.01)

(58) Field of Classification Search
CPC .. H03H 9/00; H03H 9/54; H03H 9/64; H03H 9/70
(Continued)

(56) References Cited

U.S. PATENT DOCUMENTS 6,246,153 B1 6/2001 Bishop et al.
6,671,016 B1 12/2003 Kim
(Continued)

OTHER PUBLICATIONS

Karasawa, Rei, et al., "c-Axis zig-zag polarization inverted ScAlN multilayer for FBAR transformer rectifying antenna," IEEE International Ultrasonics Symposium, 2017, Washington, DC, 4 pages.
(Continued)

*Primary Examiner* — Dean O Takaoka
(74) *Attorney, Agent, or Firm* — Withrow & Terranova, P.L.L.C.

(57) ABSTRACT

An acoustic filter apparatus is provided. In examples discussed herein, the acoustic filter apparatus includes an acoustic ladder network configured to pass a signal in a series resonance frequency and block the signal in a number of parallel resonance frequencies. The acoustic ladder network is coupled to a microelectromechanical systems (MEMS) switch circuit that includes a number of MEMS switches. The MEMS switches may be selectively controlled (e.g., closed and/or opened) to cause a modification to a selected parallel resonance frequency(s) among the parallel resonance frequencies. As such, it may be possible to flexibly configure the parallel resonance frequencies of the acoustic ladder network based on application scenarios. Further, by employing the MEMS switches having improved figure-of-merit (FOM) over conventional silicon-on-insulator (SOI) switches, it may be possible to reconfigure the parallel resonance frequencies with reduced insertion loss, thus helping to improve performance of the acoustic filter apparatus.

20 Claims, 9 Drawing Sheets

(51) Int. Cl.
  *H03H 9/56* (2006.01)
  *H01H 1/00* (2006.01)
  *H03H 9/15* (2006.01)
(58) Field of Classification Search
  USPC ........................................................ 333/133
  See application file for complete search history.

(56) References Cited

U.S. PATENT DOCUMENTS

| | | | |
|---|---|---|---|
| 7,333,831 | B2 | 2/2008 | Srinivasan et al. |
| 7,459,990 | B2 * | 12/2008 | Wunnicke ............. H03H 9/582 |
| | | | 333/133 |
| 7,515,018 | B2 | 4/2009 | Handtmann et al. |
| 8,026,776 | B2 * | 9/2011 | Ueda ................... H03H 9/6483 |
| | | | 333/133 |
| 9,985,605 | B2 * | 5/2018 | Tani ........................ H03H 9/64 |
| 10,284,174 | B2 | 5/2019 | Khlat et al. |
| 2008/0055020 | A1 | 3/2008 | Handtmann et al. |
| 2009/0273415 | A1 | 11/2009 | Frank et al. |
| 2017/0093370 | A1 | 3/2017 | Khlat et al. |
| 2018/0019731 | A1 * | 1/2018 | Tsukamoto ............ H03H 9/706 |
| 2020/0099360 | A1 | 3/2020 | Khlat |
| 2020/0099362 | A1 | 3/2020 | Khlat |
| 2020/0099363 | A1 | 3/2020 | Khlat |
| 2020/0099364 | A1 | 3/2020 | Khlat |

OTHER PUBLICATIONS

Larson, John, et al., "Characterization of Reversed c-axis AlN Thin Films," IEEE International Ultrasonics Symposium, San Diego, California, 2010, pp. 1054-1059.
Sussman-Fort, Stephen, "Matching Network Design Using Non-Foster Impedances," Antenna Products and Technologies, EDO Electronic Systems Group, ieee.li/pdf/viewgraphs/matching_network_design_non_foster_impedances, accessed Sep. 10, 2019, Bohemia, New York, 43 pages.
Non-Final Office Action for U.S. Appl. No. 16/387,940, dated Sep. 26, 2019, 10 pages.
U.S. Appl. No. 16/356,279, filed Mar. 18, 2019.
U.S. Appl. No. 16/358,913, filed Mar. 20, 2019.
U.S. Appl. No. 16/385,301, filed Apr. 16, 2019.
Notice of Allowance for U.S. Appl. No. 16/387,940, dated Jan. 21, 2020, 7 pages.
Non-Final Office Action for U.S. Appl. No. 16/358,913, dated May 7, 2020, 9 pages.
Final Office Action for U.S. Appl. No. 16/358,913, dated Sep. 28, 2020, 11 pages.
Notice of Allowance for U.S. Appl. No. 16/358,913, dated Dec. 3, 2020, 7 pages.

* cited by examiner

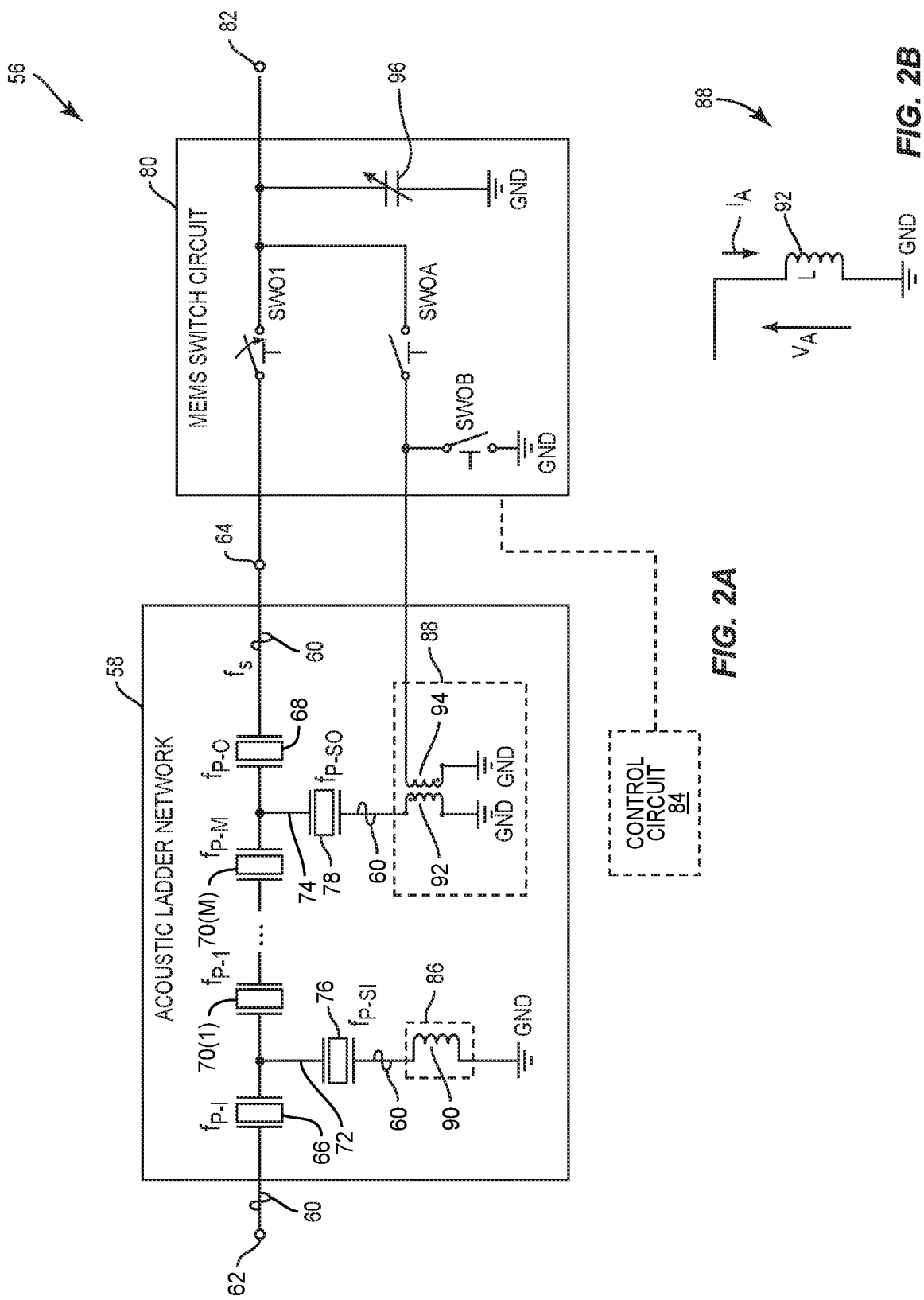

ACOUSTIC FILTER APPARATUS HAVING CONFIGURABLE PARALLEL RESONANCE FREQUENCIES

RELATED APPLICATIONS

This application claims the benefit of U.S. provisional patent application Ser. No. 62/751,188, filed on Oct. 26, 2018, the disclosure of which is incorporated herein by reference in its entirety.

FIELD OF THE DISCLOSURE

The technology of the disclosure relates generally to an acoustic filter apparatus incorporating microelectromechanical systems (MEMS) switches.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Notably, a conventional switch, such as a silicon-on-insulator (SOI) switch, may create a relatively higher on-resistance ($R_{ON}$) when the conventional switch is closed and a relatively higher off-capacitance ($C_{OFF}$) when the conventional switch is opened. Accordingly, the conventional switch may suffer a degraded figure-of-merit (FOM) (FOM=$R_{ON} \times C_{OFF}$) and cause unwanted insertion loss to degrade RF efficiency and/or performance of the wireless device. In contrast, a microelectromechanical systems (MEMS) switch typically has a FOM that is at least ⅓ lower than the FOM of the conventional SOI switch. As a result, it may be possible to reduce the unwanted insertion loss associated with the conventional SOI switch by replacing the conventional SOI switch with the MEMS switch, thus helping to improve RF efficiency and/or performance of the wireless device.

SUMMARY

Aspects disclosed in the detailed description include an acoustic filter apparatus. In examples discussed herein, the acoustic filter apparatus includes an acoustic ladder network configured to pass a signal in a series resonance frequency and block the signal in a number of parallel resonance frequencies. The acoustic ladder network is coupled to a microelectromechanical systems (MEMS) switch circuit that includes a number of MEMS switches. The MEMS switches may be selectively controlled (e.g., closed and/or opened) to cause a modification to a selected parallel resonance frequency(s) among the parallel resonance frequencies. As such, it may be possible to flexibly configure the parallel resonance frequencies of the acoustic ladder network based on application scenarios. Further, by employing the MEMS switches having improved figure-of-merit (FOM) over conventional silicon-on-insulator (SOI) switches, it may be possible to reconfigure the parallel resonance frequencies with reduced insertion loss, thus helping to improve performance of the acoustic filter apparatus.

In one aspect, an acoustic filter apparatus is provided. The acoustic filter apparatus includes an acoustic ladder network. The acoustic ladder network is configured to resonate in a series resonance frequency to pass a signal from an input node to an output node. The acoustic ladder network is also configured to block the signal from the output node in a number of parallel resonance frequencies different from the series resonance frequency. The acoustic filter apparatus also includes a MEMS switch circuit coupled to the acoustic ladder network. The MEMS switch circuit is configured to cause a modification to at least one selected parallel resonance frequency among the number of parallel resonance frequencies.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 2A is a schematic diagram of an exemplary acoustic filter apparatus configured to support dynamically reconfigurable parallel resonance frequencies in an acoustic ladder network in a first operation mode;

FIG. 2B is a schematic diagram of an exemplary equivalence of an output-stage inductance circuit in the acoustic ladder network when the acoustic filter apparatus of FIG. 2A operates in a first operation mode;

DETAILED DESCRIPTION

Figure 1A:
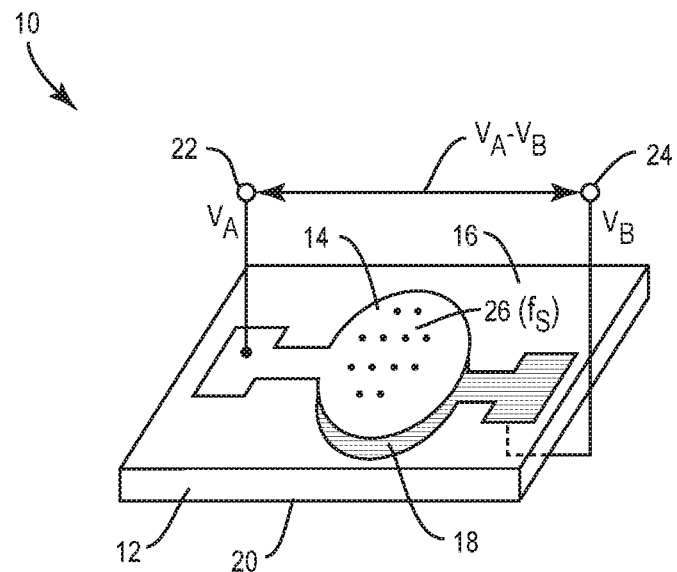
FIG. 1A is a schematic diagram of an exemplary bulk acoustic wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an acoustic filter apparatus. In examples discussed herein, the acoustic filter apparatus includes an acoustic ladder network configured to pass a signal in a series resonance frequency and block the signal in a number of parallel resonance frequencies. The acoustic ladder network is coupled to a microelectromechanical systems (MEMS) switch circuit that includes a number of MEMS switches. The MEMS switches may be selectively controlled (e.g., closed and/or opened) to cause a modification to a selected parallel resonance frequency(s) among the parallel resonance frequencies. As such, it may be possible to flexibly configure the parallel resonance frequencies of the acoustic ladder network based on application scenarios. Further, by employing the MEMS switches having improved figure-of-merit (FOM) over conventional silicon-on-insulator (SOI) switches, it may be possible to reconfigure the parallel resonance frequencies with reduced insertion loss, thus helping to improve performance of the acoustic filter apparatus.

Figure 1B:
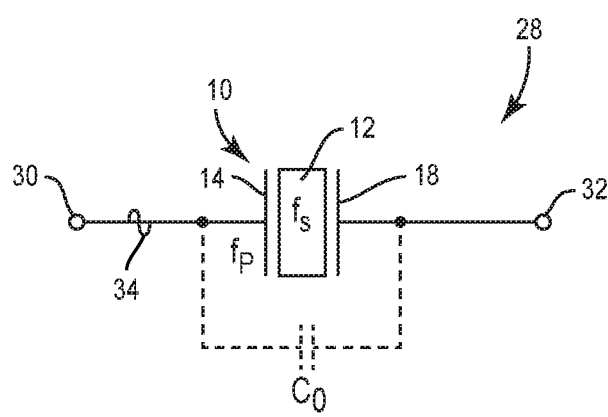
FIG. 1B is a schematic diagram of an acoustic filter configured based on the BAW resonator of FIG. 1A.
Figure 1C:
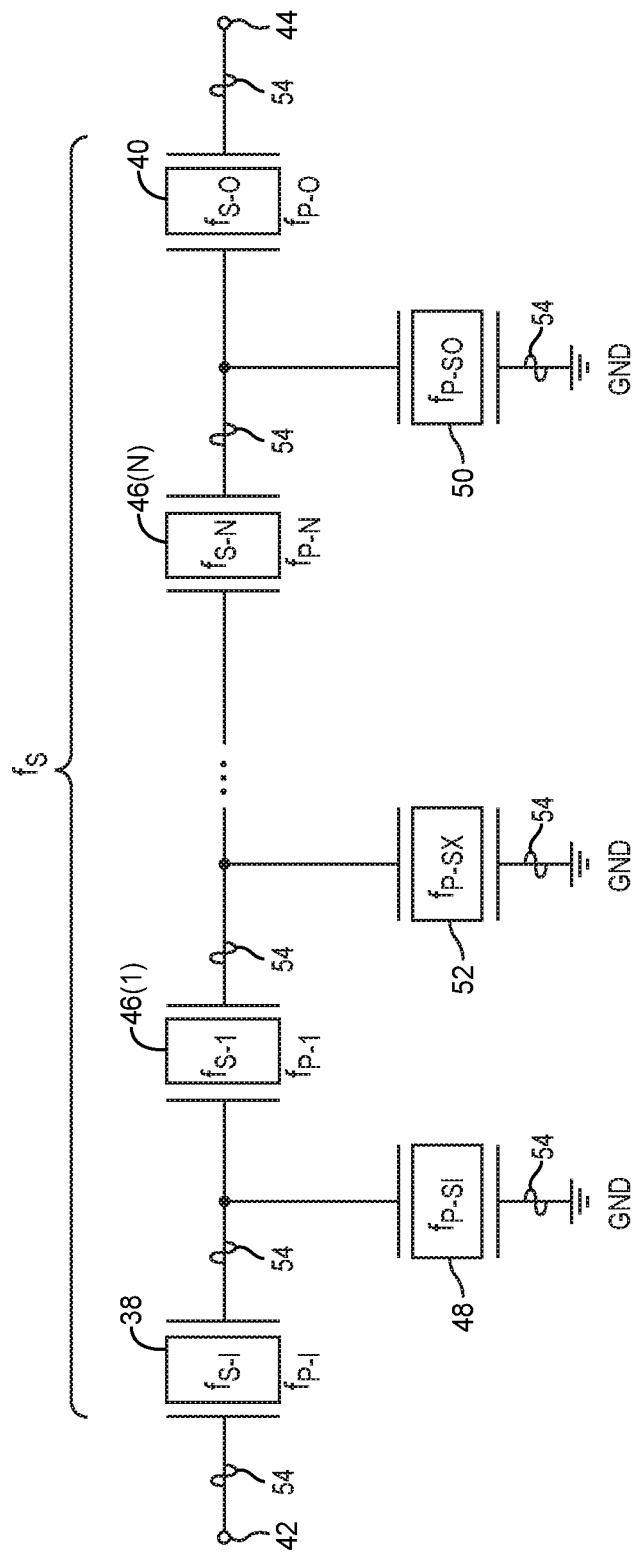
FIG. 1C is a schematic diagram of an exemplary conventional acoustic ladder network that may be formed based on the BAW resonator of FIG. 1A.

Before discussing an acoustic filter apparatus of the present disclosure, a brief overview of a bulk acoustic wave (BAW) resonator and a conventional acoustic ladder network configured based on multiple BAW resonators is first provided with reference to FIGS. 1A-1C. The discussion of specific exemplary aspects of the acoustic filter apparatus of the present disclosure starts below with reference to FIG. 2A.

In this regard, FIG. 1A is a schematic diagram of an exemplary BAW resonator 10. The BAW resonator 10 includes a piezo layer 12 (e.g., a quartz crystal), a top metal electrode 14 disposed on a top surface 16 of the piezo layer 12, and a bottom metal electrode 18 disposed on a bottom surface 20 of the piezo layer 12. When a first voltage $V_A$ and a second voltage $V_B$ are applied to a top electrical port 22 and a bottom electrical port 24, respectively, an acoustic wave 26 is excited and resonates in a series resonance frequency $f_S$ between the top surface 16 and the bottom surface 20 of the piezo layer 12. The series resonance frequency $f_S$ may be related to a thickness of the piezo layer 12 and/or a mass of the top metal electrode 14 and the bottom metal electrode 18.

The BAW resonator 10 can be configured to function as an acoustic filter in an electronic circuit. In this regard, FIG. 1B is a schematic diagram of an acoustic filter 28 configured based on the BAW resonator 10 of FIG. 1A. Common elements between FIGS. 1A and 1B are shown therein with common element numbers and will not be re-described herein.

In the acoustic filter 28, the BAW resonator 10 may be provided between an input port 30 and an output port 32. When the BAW resonator 10 resonates in the series resonance frequency $f_S$, the BAW resonator 10 functions as a short circuit to pass a signal 34 from the input port 30 to the output port 32. In contrast, the BAW resonator 10 may function as an open circuit to block the signal 34 in a parallel resonance frequency $f_P$ that differs from the series resonance frequency $f_S$. As such, a bandwidth of the series resonance frequency $f_S$ and a bandwidth of the parallel resonance frequency $f_P$ determine a passband bandwidth and a stopband bandwidth of the acoustic filter 28, respectively.

However, the top metal electrode 14 and the bottom metal electrode 18 in the BAW resonator 10 may create an electrical capacitance $C_0$ outside the series resonance frequency $f_S$. Notably, the electrical capacitance $C_0$ may cause the BAW resonator 10 to resonate at a secondary series frequency that may fall within or overlap with the parallel resonance frequency $f_P$. Consequently, the acoustic filter 28 may not be able to effectively reject the signal 34 in the entire bandwidth of the parallel resonance frequency $f_P$, thus compromising performance of the acoustic filter 28. As such, it may be desired to eliminate the electrical capacitance $C_0$ presented by the BAW resonator 10.

FIG. 1C is a schematic diagram of an exemplary conventional acoustic ladder network 36 that may be formed based on the BAW resonator 10 of FIG. 1A. The conventional acoustic ladder network 36 includes an input-stage series acoustic resonator 38 and an output-stage series acoustic resonator 40 coupled in series between an input node 42 and an output node 44. The conventional acoustic ladder network 36 may include one or more intermediate-stage series acoustic resonators 46(1)-46(N) coupled in series between the input-stage series acoustic resonator 38 and the output-stage series acoustic resonator 40. In a non-limiting example, each of the input-stage series acoustic resonator 38, the output-stage series acoustic resonator 40, and the intermediate-stage series acoustic resonators 46(1)-46(N) is identical to the BAW resonator 10 of FIG. 1A.

The conventional acoustic ladder network 36 includes an input-stage shunt acoustic resonator 48 coupled between the input-stage series acoustic resonator 38 and a ground (GND). The conventional acoustic ladder network 36 includes an output-stage shunt acoustic resonator 50 coupled between the output-stage series acoustic resonator 40 and the GND. The conventional acoustic ladder network 36 includes at least one intermediate-stage shunt acoustic resonator 52 coupled between the intermediate-stage series acoustic resonators 46(1)-46(N) and the GND. In a non-limiting example, each of the input-stage shunt acoustic resonator 48, the output-stage shunt acoustic resonator 50 and the intermediate-stage shunt acoustic resonator 52 is identical to the BAW resonator 10 of FIG. 1A.

The input-stage series acoustic resonator 38 is configured to resonate in a respective series resonance $f_{S\text{-}I}$ to pass a signal 54 to the intermediate-stage series acoustic resonators 46(1)-46(N). The intermediate-stage series acoustic resonators 46(1)-46(N) are configured to resonate in series resonance frequencies $f_{S\text{-}1}$-$f_{S\text{-}N}$, respectively, to pass the signal 54 to the output-stage series acoustic resonator 40. The output-stage series acoustic resonator 40 is configured to resonate in a respective series resonance $f_{S\text{-}O}$ to pass the signal 54 to the output node 44.

Notably, the series resonance frequencies $f_{S\text{-}I}$, $f_{S\text{-}1}$-$f_{S\text{-}N}$, and $f_{S\text{-}O}$ may be different. Hereinafter, when a first frequency is said to be different from a second frequency, it generally refers to a respective center frequency of the first frequency that is different from a respective center frequency of the second frequency. Although the series resonance frequencies $f_{S\text{-}I}$, $f_{S\text{-}1}$-$f_{S\text{-}N}$, and $f_{S\text{-}O}$ may be different, it is necessary for the series resonance frequencies $f_{S\text{-}I}$, $f_{S\text{-}1}$-$f_{S\text{-}N}$, and $f_{S\text{-}O}$ to overlap in a common series resonance frequency such that the conventional acoustic ladder network 36 can pass the signal 54 from the input node 42 to the output node 44. Accordingly, the common series resonance frequency can be referred to as a series resonance frequency $f_S$ of the conventional acoustic ladder network 36.

Like the BAW resonator 10 of FIG. 1A, the input-stage series acoustic resonator 38 is configured to block the signal 54 from the intermediate-stage series acoustic resonators 46(1)-46(N) in a respective parallel resonance frequency $f_{P\text{-}I}$. The intermediate-stage series acoustic resonators 46(1)-46(N) are configured to block the signal 54 from the output-stage series acoustic resonator 40 in parallel resonance frequencies $f_{P\text{-}1}$-$f_{P\text{-}N}$, respectively. The output-stage series acoustic resonator 40 is configured to block the signal 54 from the output node 44 in a respective parallel resonance $f_{P\text{-}O}$.

When the input-stage series acoustic resonator 38 resonates in the respective series resonance frequency $f_{S\text{-}I}$ to pass the signal 54, the input-stage shunt acoustic resonator 48 may be configured to resonate in a respective shunt resonance frequency $f_{P\text{-}SI}$ to shunt the signal 54 to the GND, thus preventing the signal 54 from reaching the intermediate-stage series acoustic resonators 46(1)-46(N). Similarly, when the intermediate-stage series acoustic resonator 46(1) resonates in a respective series resonance frequency $f_{S\text{-}1}$ to pass the signal 54, the intermediate-stage shunt acoustic resonator 52 may be configured to resonate in a respective shunt resonance frequency $f_{P\text{-}SX}$ to shunt the signal 54 to the GND, thus preventing the signal 54 from reaching subsequent intermediate-stage series acoustic resonators 46(2)-46(N). Likewise, when the intermediate-stage series acoustic resonator 46(N) resonates in a respective series resonance frequency $f_{S\text{-}N}$ to pass the signal 54, the output-stage shunt acoustic resonator 50 may be configured to resonate in a respective shunt resonance frequency $f_{P\text{-}SO}$ to shunt the signal 54 to the GND, thus preventing the signal 54 from reaching the output node 44.

In this regard, the conventional acoustic ladder network 36 may be configured to block the signal 54 in the parallel resonance frequency $f_{P\text{-}I}$, $f_{P\text{-}1}$-$f_{P\text{-}N}$, and $f_{P\text{-}O}$ as well as in the shunt resonance frequency $f_{P\text{-}SI}$, $f_{P\text{-}SX}$, and $f_{P\text{-}SO}$. Accordingly, it can be said that the conventional acoustic ladder network 36 blocks the signal 54 between the input node 42 and the output node 44 in a number of parallel resonance frequencies $f_{P\text{-}I}$, $f_{P\text{-}1}$-$f_{P\text{-}N}$, $f_{P\text{-}O}$, $f_{P\text{-}SI}$, $f_{P\text{-}SX}$, and $f_{P\text{-}SO}$.

Notably, the parallel resonance frequencies $f_{P\text{-}I}$, $f_{P\text{-}1}$-$f_{P\text{-}N}$, $f_{P\text{-}O}$, $f_{P\text{-}SI}$, $f_{P\text{-}SX}$, and $f_{P\text{-}SO}$ of the conventional acoustic ladder network 36 may be inherently determined by the series and shunt acoustic resonators in the conventional acoustic ladder network 36. In this regard, the parallel resonance frequencies $f_{P\text{-}I}$, $f_{P\text{-}1}$-$f_{P\text{-}N}$, $f_{P\text{-}O}$, $f_{P\text{-}SI}$, $f_{P\text{-}SX}$, and $f_{P\text{-}SO}$ may be inherently fixed. In this regard, it may be desired to dynamically modify one or more of the parallel resonance frequencies $f_{P\text{-}I}$, $f_{P\text{-}1}$-$f_{P\text{-}N}$, $f_{P\text{-}O}$, $f_{P\text{-}SI}$, $f_{P\text{-}SX}$, and $f_{P\text{-}SO}$ without altering physical structure of the conventional acoustic ladder network 36.

In this regard, FIG. 2A is a schematic diagram of an exemplary acoustic filter apparatus 56 configured to support dynamically reconfigurable parallel resonance frequencies in an acoustic ladder network 58 in a first operation mode. In a non-limiting example, the acoustic ladder network 58 can be functionally equivalent to the conventional acoustic ladder network 36 of FIG. 1C. In this regard, the acoustic ladder network 58 can be configured to resonate in a series resonance frequency $f_S$ to pass a signal 60 from an input node 62 to an output node 64 and block the signal 60 between the input node 62 and the output node 64 in a number of parallel resonance frequencies $f_P$.

For example, the acoustic ladder network 58 includes an input-stage series acoustic resonator 66 coupled to the input node 62 and an output-stage series acoustic resonator 68 coupled to the output node 64. The acoustic ladder network 58 may also include a number of intermediate-stage series acoustic resonators 70(1)-70(M) coupled in series between the input-stage series acoustic resonator 66 and the output-stage series acoustic resonator 68. Similar to the input-stage series acoustic resonator 38, the output-stage series acoustic resonator 40, and the intermediate-stage series acoustic resonators 46(1)-46(N) in FIG. 1C, the input-stage series acoustic resonator 66, the output-stage series acoustic resonator 68, and the intermediate-stage series acoustic resonators 70(1)-70(M) may resonate in respective series resonance frequencies that slightly differ from each other, but overlap in the series resonance frequency $f_S$ to allow the signal 60 to pass from the input node 62 to the output node 64. In addition, the input-stage series acoustic resonator 66, the output-stage series acoustic resonator 68, and the intermediate-stage series acoustic resonators 70(1)-70(M) may block the signal 60 between the input node 62 and the output node 64 in respective parallel resonance frequencies $f_{P-I}$, $f_{P-1}$-$f_{P-M}$, $f_{P-O}$.

The acoustic ladder network 58 also includes an input-stage shunt branch 72 coupled between the input-stage series acoustic resonator 66 and the GND and an output-stage shunt branch 74 coupled between the output-stage series acoustic resonator 68 and the GND. The input-stage shunt branch 72 includes an input-stage shunt acoustic resonator 76, which may be functionally equivalent to the input-stage shunt acoustic resonator 48 in FIG. 1C. The output-stage shunt branch 74 includes an output-stage shunt acoustic resonator 78, which may be functionally equivalent to the output-stage shunt acoustic resonator 50 in FIG. 1C. Like the input-stage shunt acoustic resonator 48 and the output-stage shunt acoustic resonator 50, the input-stage shunt acoustic resonator 76 and the output-stage shunt acoustic resonator 78 are configured to resonate in respective parallel resonance frequencies $f_{P-SI}$ and $f_{P-SO}$ to shunt the signal 60 to the GND. Hereinafter, the respective parallel resonance frequencies $f_{P-I}$, $f_{P-1}$-$f_{P-M}$, $f_{P-O}$, $f_{P-SI}$, and $f_{P-SO}$ are collectively referred to the parallel resonance frequencies $f_P$ of the acoustic ladder network 58.

The parallel resonance frequencies $f_P$ of the acoustic ladder network 58 may be inherently determined by acoustic resonators, such as the input-stage series acoustic resonator 66, the input-stage shunt acoustic resonator 76, the output-stage series acoustic resonator 68, and the output-stage shunt acoustic resonator 78, in the acoustic ladder network 58. In this regard, the parallel resonance frequencies $f_P$ of the acoustic ladder network 58 may become static once the acoustic resonators are provided in the acoustic ladder network 58. However, it may be possible to dynamically modify at least one selected parallel resonance frequency among the parallel resonance frequencies $f_P$ without changing physical structure of the acoustic ladder network 58. As such, it may be possible to dynamically reconfigure the acoustic filter apparatus 56 to block the signal 60 in additional parallel resonance frequencies for a specific application scenario(s).

In this regard, the acoustic filter apparatus 56 further includes a MEMS switch circuit 80 coupled between the acoustic ladder network 58 and a signal output 82. The MEMS switch circuit 80 may be controlled, for example by a control circuit 84, to cause modification to the selected parallel resonance frequency among the parallel resonance frequencies $f_P$ without altering the physical structure of the acoustic ladder network 58.

Notably, the acoustic ladder network 58 is different from the conventional acoustic ladder network 36 of FIG. 1C in that the input-stage shunt branch 72 includes an input-stage inductance circuit 86 and the output-stage shunt branch 74 includes an output-stage inductance circuit 88. In one exemplary embodiment, the output-stage shunt acoustic resonator 78 is coupled directly to the output-stage series acoustic resonator 68 and the output-stage inductance circuit 88 is coupled between the output-stage shunt acoustic resonator 78 and the GND. Similarly, the input-stage shunt acoustic resonator 76 is coupled directly to the input-stage acoustic resonator 66 and the input-stage inductance circuit 86 is coupled between the input-stage shunt acoustic resonator 76 and the GND.

The input-stage inductance circuit 86 may include an input-stage inductor 90 coupled between the input-stage shunt acoustic resonator 76 and the GND. The output-stage inductance circuit 88 may include a first output-stage inductor 92 and a second output-stage inductor 94 negatively coupled to the first output-stage inductor 92. Notably, the second output-stage inductor 94 is said to be negatively coupled to the first output-stage inductor 92 when a mutual-inductance (M) between the first output-stage inductor 92 and the second output-stage inductor 94 can be expressed as equation (Eq. 1) below.

$$M = -k*L \qquad (\text{Eq. 1})$$

In the equation (Eq. 1) above, k represents a coupling factor (0<k<1) and L represents a respective self-inductance of the first output-stage inductor 92 and the second output-stage inductor 94. In an exemplary configuration, the first output-stage inductor 92 is coupled between the output-stage shunt acoustic resonator 78 and the GND and the second output-stage inductor 94 is coupled between the MEMS switch circuit 80 and the GND.

The MEMS switch circuit 80 may include a first output-stage MEMS switch SWO1, an output-stage series MEMS switch SWOA, and an output-stage shunt MEMS switch SWOB. In a non-limiting example, the first output-stage MEMS switch SWO1 is coupled between the output-stage series acoustic resonator 68 and the signal output 82, the output-stage series MEMS switch SWOA is coupled between the second output-stage inductor 94 and the signal output 82, and the output-stage shunt MEMS switch SWOB is coupled between second output-stage inductor 94 and the GND. The MEMS switch circuit 80 may include an output-stage adjustable capacitor 96, which may be coupled between the signal output 82 and the GND.

In a first operation mode, the MEMS switch circuit 80 may be configured to close the first output-stage MEMS switch SWO1 concurrent to opening the output-stage series MEMS switch SWOA and the output-stage shunt MEMS switch SWOB. In this regard, FIG. 2B is a schematic diagram of an exemplary equivalence of the output-stage inductance circuit 88 when the acoustic filter apparatus 56 operates in the first operation mode. Common elements between FIGS. 2A and 2B are shown therein with common element numbers and will not be re-described herein.

Since the output-stage series MEMS switch SWOA is open, there will be no current flowing through the second output-stage inductor 94. Thus, only the first output-stage inductor 92 is functioning. In this regard, in the first operation mode, a first voltage $V_A$ across the first output-stage inductor 92 may induce a first current $I_A$, which may be determined based on equation (Eq. 2) below.

$$I_A = \frac{V_A}{j2\pi f_{P-SO}*L} \qquad (\text{Eq. 2})$$

As a result, the respective inductance of the output-stage inductance circuit 88 may be modified, thus causing a modification to the respective parallel resonance frequency $f_{P-SO}$ of the output-stage shunt acoustic resonator 78.

Figures 3A, 3B:
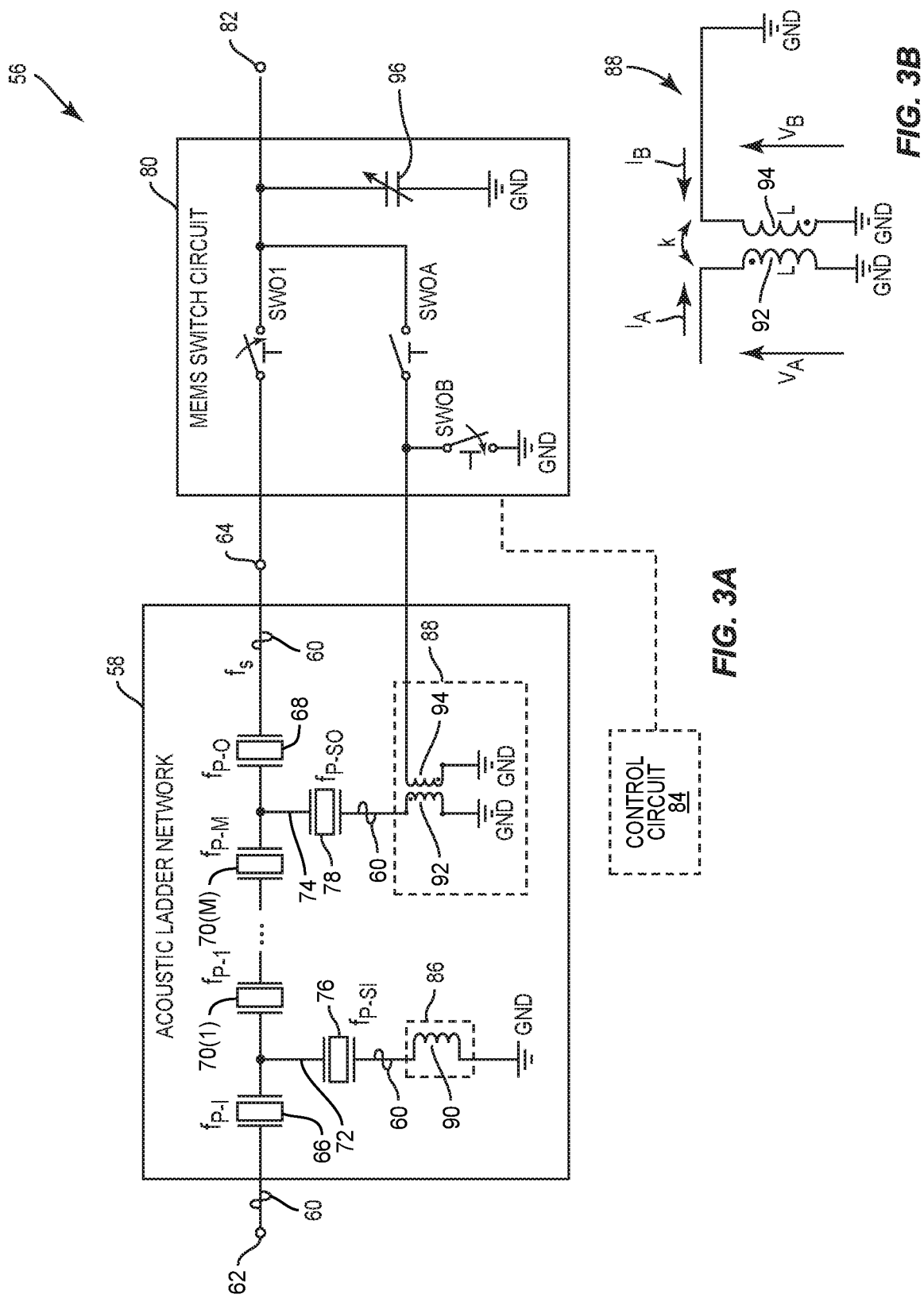
FIG. 3A is a schematic diagram providing an exemplary illustration of the acoustic filter apparatus of FIG. 2A configured to operate in a second operation mode.
FIG. 3B is a schematic diagram of an exemplary equivalence of an output-stage inductance circuit in the acoustic ladder network when the acoustic filter apparatus of FIG. 3A operates in a second operation mode.

FIG. 3A is a schematic diagram providing an exemplary illustration of the acoustic filter apparatus 56 of FIG. 2A configured to operate in a second operation mode. Common elements between FIGS. 2A and 3A are shown therein with common element numbers and will not be re-described herein.

In the second operation mode, the MEMS switch circuit 80 can be controlled (e.g., by the control circuit 84) to close the first output-stage MEMS switch SWO1 and the output-stage shunt MEMS switch SWOB concurrent to opening the output-stage series MEMS switch SWOA. In this regard, FIG. 3B is a schematic diagram of an exemplary equivalence of the output-stage inductance circuit 88 when the acoustic filter apparatus 56 operates in the second operation mode. Common elements between FIGS. 3A and 3B are shown therein with common element numbers and will not be re-described herein.

In a non-limiting example, the first output-stage inductor 92 induces a first current $I_A$ when a first voltage $V_A$ is applied across the first output-stage inductor 92. Likewise, the second output-stage inductor 94 induces a second current $I_B$ when a second voltage $V_B$ is applied across the second output-stage inductor 94. The first voltage $V_A$ and the second voltage $V_B$ are related to the first current $I_A$ and the second current $I_B$ based on equations (Eq. 3.1 and 3.2) below.

$$V_A = j\omega L I_A + j\omega M I_B \quad \text{(Eq. 3.1)}$$

$$V_B = j\omega M I_A + j\omega L I_B \quad \text{(Eq. 3.2)}$$

In the equations above, M represents a mutual inductance of the first output-stage inductor 92 and the second output-stage inductor 94, and $\omega$ equals $2\pi f_{P-SO}$. When the output-stage shunt MEMS switch SWOB is closed, the second voltage $V_B$ across the second output-stage inductor 94 equals zero. Thus, according to the equation (Eq. 3.2), the second current $I_B$ may be determined based on equation (Eq. 3.3) as below.

$$V_B = j\omega M I_A + j\omega L I_B = 0 \rightarrow I_B = -(M/L)*I_A \quad \text{(Eq. 3.3)}$$

Accordingly, the equation (Eq. 3.2) can be further expressed as equation (Eq. 3.4) below.

$$V_A = j\omega L I_A + j\omega M I_B = j\omega L I_A - j\omega (M^2/L)*I_A \quad \text{(Eq. 3.4)}$$

As stated earlier, the first output-stage inductor 92 and the second output-stage inductor 94 are negatively coupled. As such, the mutual inductance M can be determined based on the equation (Eq. 1) above. Accordingly, the equation (Eq. 3.4) can be further expressed as equation (Eq. 3.5) below.

$$\begin{aligned} V_A &= j\omega L I_A + j\omega M I_B = j\omega L I_A - j\omega(M^2/L)*I_A \\ &= j\omega L I_A - j\omega(k^2 L)*I_A = j\omega(1-k^2)L*I_A \end{aligned} \quad \text{(Eq. 3.5)}$$

Given that the coupling factor k is always less than one (1), the output-stage inductance circuit 88 would generate a modified inductance that is less than the respective self-inductance L, thus causing a modification to the respective parallel resonance frequency $f_{P-SO}$ of the output-stage shunt acoustic resonator 78.

Figure 4:
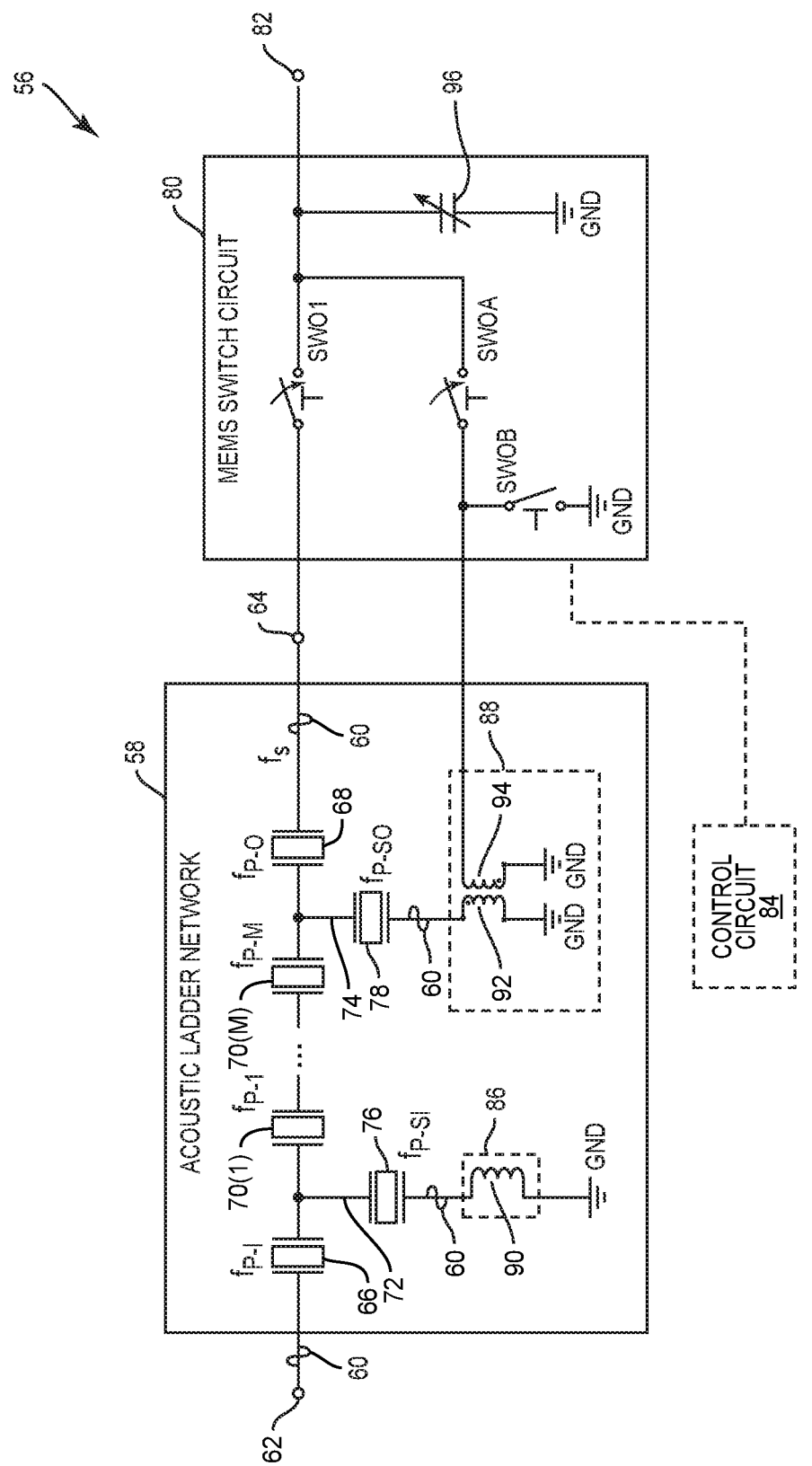
FIG. 4 is a schematic diagram providing an exemplary illustration of the acoustic filter apparatus of FIG. 2A configured to operate in a third operation mode.

FIG. 4 is a schematic diagram providing an exemplary illustration of the acoustic filter apparatus 56 of FIG. 2A configured to operate in a third operation mode. Common elements between FIGS. 2A and 4 are shown therein with common element numbers and will not be re-described herein.

In the third operation mode, the MEMS switch circuit 80 can be controlled (e.g., by the control circuit 84) to close the first output-stage MEMS switch SWO1 and the output-stage series MEMS switch SWOA concurrent to opening the output-stage shunt MEMS switch SWOB. By closing the output-stage series MEMS switch SWOA, the MEMS switch circuit 80 may cause a transversal and/or negative capacitance across the output-stage series acoustic resonator 68, thus modifying the respective parallel resonance frequency $f_{P-O}$.

Figure 5:
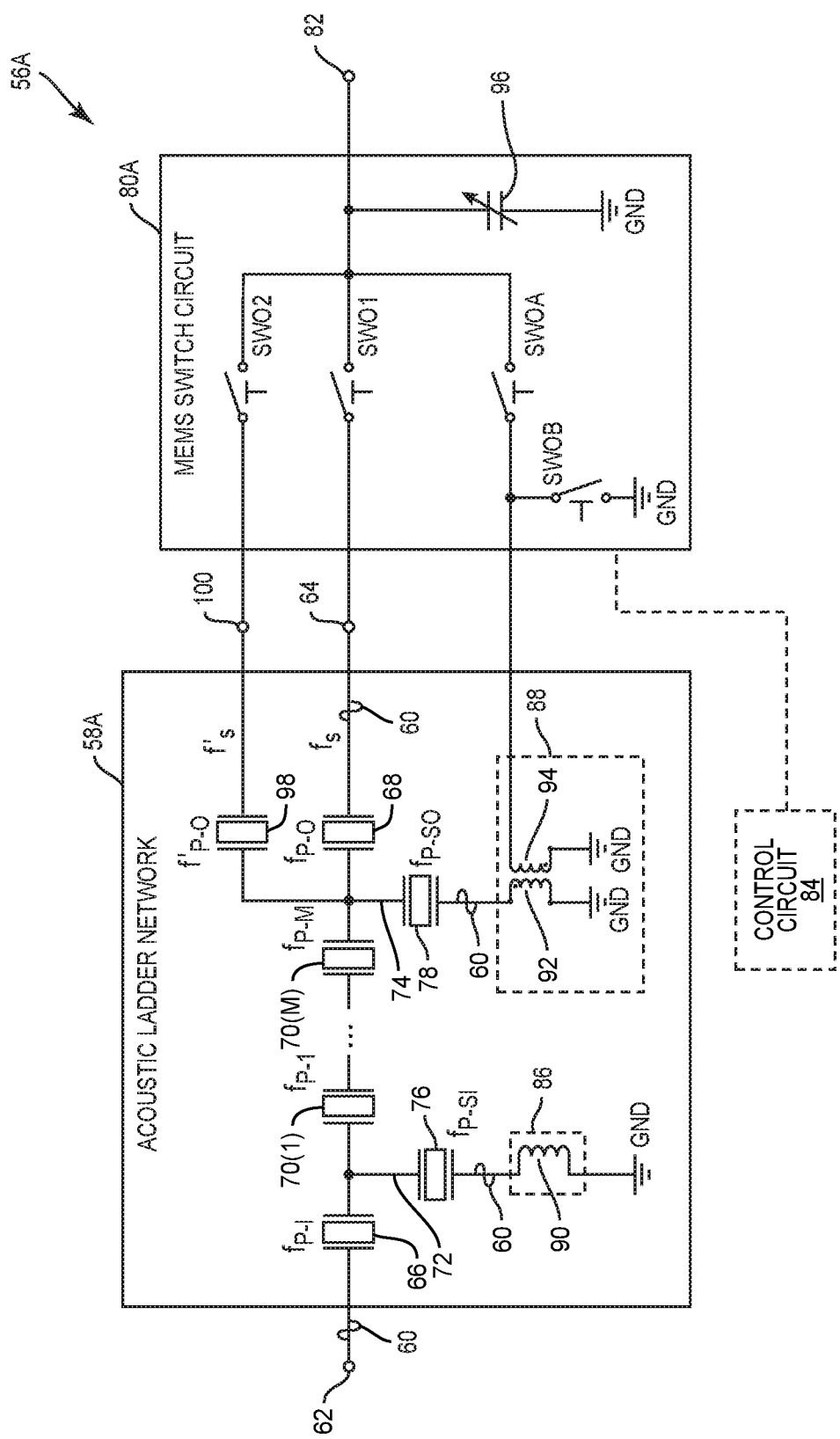
FIG. 5 is a schematic diagram of an exemplary acoustic filter apparatus configured according to another embodiment of the present disclosure.

FIG. 5 is a schematic diagram of an exemplary acoustic filter apparatus 56A configured according to another embodiment of the present disclosure. Common elements between FIGS. 2A and 5 are shown therein with common element numbers and will not be re-described herein.

The acoustic filter apparatus 56A includes an acoustic ladder network 58A and a MEMS switch circuit 80A. The acoustic ladder network 58A includes at least one second output-stage series acoustic resonator 98 coupled in parallel to the output-stage series acoustic resonator 68. In a non-limiting example, the second output-stage acoustic series resonator 98 is configured to resonate in at least one second series resonance frequency $f'_S$ to pass the signal 60 to at least one second output node 100 and block the signal 60 from the second output node 100 in at least one second respective parallel resonance frequency $f'_{P-O}$.

The MEMS switch circuit 80A includes at least one second output-stage MEMS switch SWO2 coupled between the second output-stage series acoustic resonator 98 and the signal output 82. The MEMS switch circuit 80A may be controlled to toggle the second output-stage MEMS switch SWO2 in the first operation mode, the second operation mode, or the third operation mode in a similar manner as operating the first output-stage MEMS switch SWO1.

Figure 6:
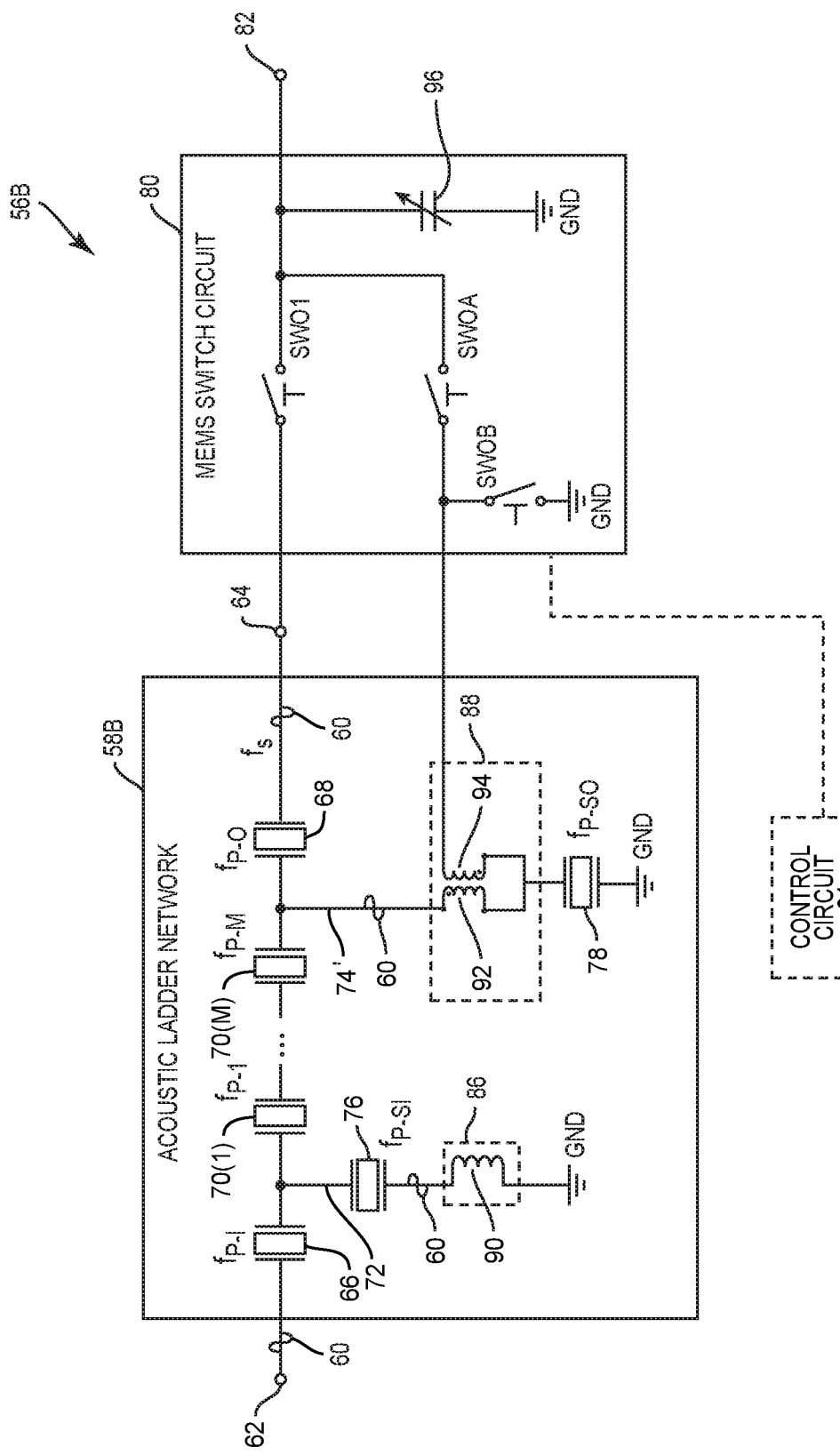
FIG. 6 is a schematic diagram of an exemplary acoustic filter apparatus configured according to another embodiment of the present disclosure.

FIG. 6 is a schematic diagram of an exemplary acoustic filter apparatus 56B configured according to another embodiment of the present disclosure. Common elements between FIGS. 2A and 6 are shown therein with common element numbers and will not be re-described herein.

The acoustic filter apparatus 56B includes an acoustic ladder network 58B, which includes an output-stage shunt branch 74'. The output-stage shunt branch 74' includes the output-stage inductance circuit 88, which is coupled directly to the output-stage series acoustic resonator 68, and the output-stage shunt acoustic resonator 78 that is coupled between the output-stage inductance circuit 88 and the GND.

Figure 7:
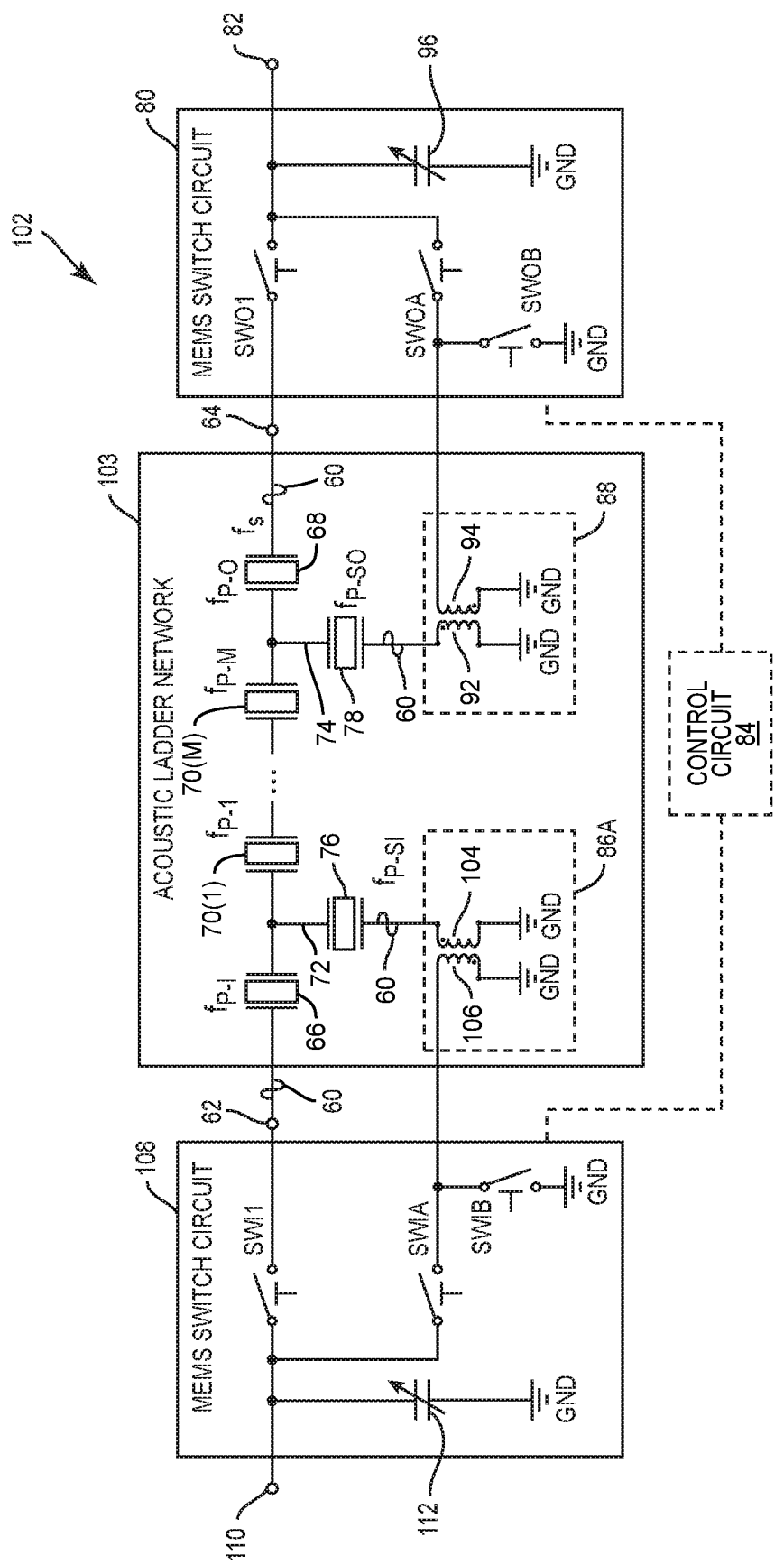
FIG. 7 is a schematic diagram of an exemplary acoustic filter apparatus configured according to another embodiment of the present disclosure.

FIG. 7 is a schematic diagram of an exemplary acoustic filter apparatus 102 configured according to another embodiment of the present disclosure. Common elements between FIGS. 2A and 7 are shown therein with common element numbers and will not be re-described herein.

The acoustic filter apparatus 102 includes an acoustic ladder network 103. The acoustic ladder network 103 differs from the acoustic ladder network 58 in FIG. 2A in that the acoustic ladder network 103 includes an input-stage inductance circuit 86A. In one embodiment, the input-stage inductance circuit 86A may be coupled directly to the input-stage series acoustic resonator 66 and the input-stage shunt acoustic resonator 76 may be coupled in between the input-stage inductance circuit 86A and the GND. In another embodiment, the input-stage shunt acoustic resonator 76 may be directly coupled to the input-stage series acoustic resonator 66 and the input-stage inductance circuit 86A may be coupled between the input-stage shunt acoustic resonator 76 and the GND.

The input-stage inductance circuit 86A includes a first input-stage inductor 104 and a second input-stage inductor 106. The first input-stage inductor 104 may be coupled in between the input-stage shunt acoustic resonator 76 and the GND. The second input-stage inductor 106 may be negatively coupled to the first input-stage inductor 104. In this regard, the first input-stage inductor 104 and the second input-stage inductor 106 can have a respective mutual inductance M in accordance to the equation (Eq. 1).

The acoustic filter apparatus 102 includes a second MEMS switch circuit 108. The second MEMS switch circuit 108 includes an input-stage MEMS switch SWI1, an input-stage series MEMS switch SWIA, and an input-stage shunt MEMS switch SWIB. The input-stage MEMS switch SWI1 may be coupled between the input-stage series acoustic resonator 66 and a signal input 110. The input-stage series MEMS switch SWIA may be coupled between the signal input 110 and the second input-stage inductor 106. The input-stage shunt MEMS switch SWIB may be coupled between the second input-stage inductor 106 and the GND. The second MEMS switch circuit 108 may include an input-stage adjustable capacitor 112, which may be coupled between the signal input 110 and the GND.

Like the MEMS switch circuit 80, the second MEMS switch circuit 108 may be configured to operate in the first operation mode, the second operation mode, and the third operation mode. In the first operation mode, the input-stage MEMS switch SWI1 is closed. Concurrently, the input-stage series MEMS switch SWIA and the input-stage shunt MEMS switch SWIB are kept open. Accordingly, the second MEMS switch circuit 108 can cause a modification to the respective parallel resonance frequency $f_{P-SI}$. In the second operation mode, the input-stage MEMS switch SWI1 and the input-stage shunt MEMS switch SWIB are closed. Concurrently, the input-stage series MEMS switch SWIA is kept open. Accordingly, the second MEMS switch circuit 108 can cause a modification to the respective parallel resonance frequency $f_{P-SI}$. In the third operation mode, the input-stage MEMS switch SWI1 and the input-stage series MEMS switch SWIA are closed. Concurrently, the input-stage shunt MEMS switch SWIB is kept open. Accordingly, the second MEMS switch circuit 108 can cause a modification to the respective parallel resonance frequency $f_{P-I}$.

Notably, the MEMS switch circuit 80 and the second MEMS switch circuit 108 may be configured to operate in an identical operation mode. For example, the MEMS switch circuit 80 and the second MEMS switch circuit 108 both operate in the first operation mode. Alternatively, the MEMS switch circuit 80 and the second MEMS switch circuit 108 may be configured to operate in different operation modes. For example, the MEMS switch circuit 80 may operate in the first mode while the second MEMS switch circuit 108 operates in the second mode. By providing the MEMS switch circuit 80 and the second MEMS switch circuit 108 in the acoustic filter apparatus 102, it may be possible to dynamically modify more parallel resonance frequencies, thus allowing the acoustic filter apparatus 102 to support even more application scenarios.

Figure 8:
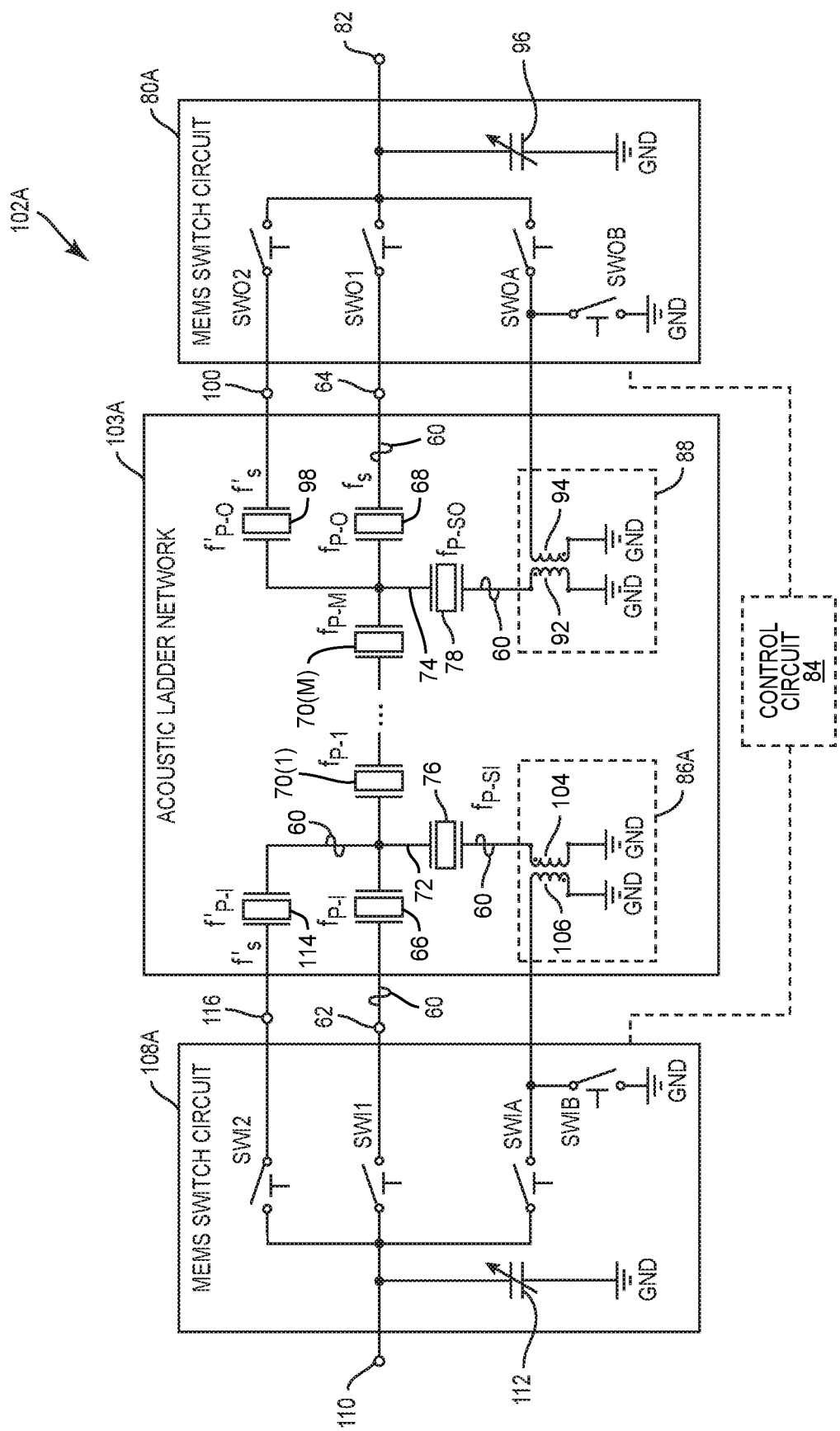
FIG. 8 is a schematic diagram of an exemplary acoustic filter apparatus configured according to another embodiment of the present disclosure.

FIG. 8 is a schematic diagram of an exemplary acoustic filter apparatus 102A configured according to another embodiment of the present disclosure. Common elements between FIGS. 5, 7, and 8 are shown therein with common element numbers and will not be re-described herein.

The acoustic filter apparatus 102A includes an acoustic ladder network 103A and a second MEMS switch circuit 108A. The acoustic ladder network 103A includes at least one second input-stage series acoustic resonator 114 coupled in parallel to the input-stage series acoustic resonator 66. In a non-limiting example, the second input-stage series acoustic resonator 114 is configured to resonate in the second series resonance frequency $f'_S$ to pass the signal 60 from at least one second input node 116 toward the second output node 100 and block the signal 60 from the second output node 100 in at least one second respective parallel resonance frequency $f'_{P-I}$.

The second MEMS switch circuit 108A includes at least one second input-stage MEMS switch SWI2 coupled between the signal input 110 and the second input-stage series acoustic resonator 114. The second MEMS switch circuit 108A may be controlled to toggle the second input-stage MEMS switch SWI2 in the first operation mode, the second operation mode, or the third operation mode in a similar manner as operating the first input-stage MEMS switch SWI1.

Those skilled in the art will recognize improvements and modifications to the embodiments of the present disclosure. All such improvements and modifications are considered within the scope of the concepts disclosed herein and the claims that follow.

What is claimed is:

1. An acoustic filter apparatus comprising:
    an acoustic ladder network configured to:
        resonate in a series resonance frequency to pass a signal from an input node to an output node; and
        block the signal from the output node in a plurality of parallel resonance frequencies different from the series resonance frequency; and
    a microelectromechanical systems (MEMS) switch circuit coupled to the acoustic ladder network via an inductance circuit and configured to cause a modification to at least one selected parallel resonance frequency among the plurality of parallel resonance frequencies.

2. The acoustic filter apparatus of claim 1 further comprising a control circuit configured to control the MEMS switch circuit to cause the at least one selected parallel resonance frequency to be modified.

3. The acoustic filter apparatus of claim 1 wherein the acoustic ladder network comprises:
    an output-stage series acoustic resonator coupled to the output node and configured to:
        resonate in the series resonance frequency to pass the signal to the output node; and
        block the signal from the output node in a respective parallel resonance frequency among the plurality of parallel resonance frequencies; and
    an output-stage shunt branch comprising an output-stage shunt acoustic resonator and the inductance circuit comprising an output-stage inductance circuit coupled between the output-stage series acoustic resonator and a ground, the output-stage shunt branch is configured to shunt the signal to the ground in a respective parallel resonance frequency among the plurality of parallel resonance frequencies.

4. The acoustic filter apparatus of claim 3 wherein:
    the output-stage shunt acoustic resonator is coupled directly to the output-stage series acoustic resonator; and
    the output-stage inductance circuit is coupled between the output-stage shunt acoustic resonator and the ground.

5. The acoustic filter apparatus of claim 3 wherein:
    the output-stage inductance circuit is coupled directly to the output-stage series acoustic resonator; and
    the output-stage shunt acoustic resonator is coupled between the output-stage inductance circuit and the ground.

6. The acoustic filter apparatus of claim 3 wherein the output-stage inductance circuit comprises:
    a first output-stage inductor coupled to the output-stage shunt acoustic resonator; and a second output-stage inductor negatively coupled to the first output-stage inductor.

7. The acoustic filter apparatus of claim 6 wherein the MEMS switch circuit comprises:
a first output-stage MEMS switch coupled between the output node and a signal output;
an output-stage series MEMS switch coupled between the second output-stage inductor and the signal output; and
an output-stage shunt MEMS switch coupled between the second output-stage inductor and the ground.

8. The acoustic filter apparatus of claim 7 wherein the MEMS switch circuit is further configured to close the first output-stage MEMS switch concurrent to opening the output-stage series MEMS switch and the output-stage shunt MEMS switch to cause the respective parallel resonance frequency of the output-stage shunt branch to be modified.

9. The acoustic filter apparatus of claim 7 wherein the MEMS switch circuit is further configured to close the first output-stage MEMS switch and the output-stage shunt MEMS switch concurrent to opening the output-stage series MEMS switch to cause the respective parallel resonance frequency of the output-stage shunt branch to be modified.

10. The acoustic filter apparatus of claim 7 wherein the MEMS switch circuit is further configured to close the first output-stage MEMS switch and the output-stage series MEMS switch concurrent to opening the output-stage shunt MEMS switch to cause the respective parallel resonance frequency of the output-stage series acoustic resonator to be modified.

11. The acoustic filter apparatus of claim 7 wherein:
the acoustic ladder network further comprises at least one second output-stage series acoustic resonator coupled in parallel to the output-stage series acoustic resonator; and
the MEMS switch circuit further comprises at least one second output-stage MEMS switch coupled between the at least one second output-stage series acoustic resonator and the signal output.

12. The acoustic filter apparatus of claim 3 wherein the acoustic ladder network further comprises:
an input-stage series acoustic resonator coupled to the input node and configured to:
resonate in the series resonance frequency to pass the signal from the input node to the output node; and
block the signal from the output node in a respective parallel resonance frequency among the plurality of parallel resonance frequencies; and
an input-stage shunt branch comprising an input-stage shunt acoustic resonator and the inductance circuit comprising an input-stage inductance circuit coupled between the input-stage series acoustic resonator and the ground, the input-stage shunt branch is configured to shunt the signal to the ground in a respective parallel resonance frequency among the plurality of parallel resonance frequencies.

13. The acoustic filter apparatus of claim 12 wherein:
the input-stage shunt acoustic resonator is coupled directly to the input-stage series acoustic resonator; and
the input-stage inductance circuit is coupled between the input-stage shunt acoustic resonator and the ground.

14. The acoustic filter apparatus of claim 12 wherein:
the input-stage inductance circuit is coupled directly to the input-stage series acoustic resonator; and
the input-stage shunt acoustic resonator is coupled between the input-stage inductance circuit and the ground.

15. The acoustic filter apparatus of claim 12 wherein the input-stage inductance circuit comprises an input-stage inductor coupled between the input-stage series acoustic resonator and the ground.

16. The acoustic filter apparatus of claim 12 wherein the input-stage inductance circuit comprises:
a first input-stage inductor coupled to the input-stage shunt acoustic resonator; and
a second input-stage inductor negatively coupled to the first input-stage inductor.

17. The acoustic filter apparatus of claim 16 further comprising a second MEMS switch circuit comprising:
an input-stage MEMS switch coupled between a signal input and the input node;
an input-stage series MEMS switch coupled between the signal input and the second input-stage inductor; and
an input-stage shunt MEMS switch coupled between the second input-stage inductor and the ground.

18. The acoustic filter apparatus of claim 17 wherein the second MEMS switch circuit is configured to close the input-stage MEMS switch concurrent to opening the input-stage series MEMS switch and the input-stage shunt MEMS switch to cause the respective parallel resonance frequency of the input-stage shunt branch to be modified.

19. The acoustic filter apparatus of claim 17 wherein the second MEMS switch circuit is configured to close the input-stage MEMS switch and the input-stage shunt MEMS switch concurrent to opening the input-stage series MEMS switch to cause the respective parallel resonance frequency of the input-stage shunt branch to be modified.

20. The acoustic filter apparatus of claim 17 wherein the MEMS switch circuit is further configured to close the input-stage MEMS switch and the input-stage series MEMS switch concurrent to opening the input-stage shunt MEMS switch to cause the respective parallel resonance frequency of the input-stage series acoustic resonator to be modified.

* * * * *